United States Patent [19]
Yamada et al.

[11] Patent Number: 5,440,384
[45] Date of Patent: Aug. 8, 1995

[54] METHODS OF INSPECTING WAFERS FOR MANUFACTURING LIGHT EMITTING ELEMENTS

[75] Inventors: Masato Yamada; Makoto Kawasaki; Yutaka Tamura, all of Annaka, Japan

[73] Assignee: Shin-Etsu Handotai Kabushiki Kaisha, Tokyo, Japan

[21] Appl. No.: 113,189

[22] Filed: Aug. 30, 1993

[30] Foreign Application Priority Data

Sep. 10, 1992 [JP] Japan .................. 4-268222

[51] Int. Cl.$^6$ ............................. G01N 21/88
[52] U.S. Cl. ........................ 356/237; 356/239
[58] Field of Search .............. 356/432, 237, 239

[56] References Cited

FOREIGN PATENT DOCUMENTS 61-039596 7/1986 Japan .
61-269389 11/1986 Japan .
63-250835 2/1989 Japan .
WO8401034 3/1984 WIPO .

OTHER PUBLICATIONS

Tadatomo, et al., "Defects in the active layer p-A10.3-5Ga0.65As of high-brightness red-light emitting diodes", Semiconductor Science and Technology, vol. 7, No. 1A, Jan. 1992, pp. A98-A103.

Black, J. F., et al., "The use of laser-induced photoluminescence to evaluate GaAsP wafers for red-light emitting diodes", Journal of the Electrochemical Society, vol. 119, No. 3, Mar. 1972, pp. 369-372.

Primary Examiner—Vincent P. McGraw
Attorney, Agent, or Firm—Ronald R. Snider

[57] ABSTRACT

An irradiation light containing a light which wave length is not absorbed by the n-type clad layer, but is absorbed by the p-type active layer, is applied on the wafer for manufacturing light emitting elements with a double-hetero structure of a p-type clad layer, a p-type active layer and an n-type clad layer formed one after another on a semiconductor substrate. Defects are found by detecting the increased photoluminescent light due to generation of a conductivity-type inverted layer such as the n-type inverted layer. When the double-hetero structure is composed of a GaAlAs mixed crystal compound semiconductor, the irradiation light which contains a wavelength range of 600-650 nm is applied. When the defective area is an active layer deficient area, detection is conducted by using the reflection light from the surface of the semiconductor substrate.

17 Claims, 7 Drawing Sheets

METHODS OF INSPECTING WAFERS FOR MANUFACTURING LIGHT EMITTING ELEMENTS

BACKGROUND OF THE INVENTION

1. Field of the Invention

This invention relates to methods of inspecting wafers for manufacturing light emitting elements, and more precisely, methods of inspecting wafers for manufacturing light emitting elements with the double-hetero structure formed on them.

2. Prior Art

Light emitting elements such as light emitting diodes are usually obtained by layering a plurality of semiconductor layers on a semiconductor substrate to prepare a wafer for manufacturing light emitting elements with a pn junction(s), and making it into an element.

Figure 11:
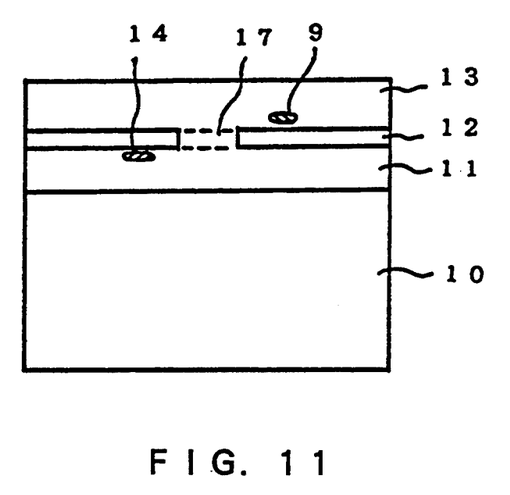
FIG. 11 shows a cross section of a wafer for manufacturing light emitting elements in which there are various defects.

FIG. 11 is an example of a light emitting diode. It shows a cross section of a GaAlAs wafer for manufacturing light emitting elements which has the double-hetero (DB) structure. In this figure, a p-type clad layer 11 consisting of a mixed crystal compound semiconductor represented by Ga1-zAlzAs (where $0<z<1$), a p-type active layer 12 consisting of a mixed crystal compound semiconductor represented by Ga1-xAlxAs (where $0<x<0.7$), and a n-type clad layer 13 consisting of a mixed crystal compound semiconductor represented by Ga1-yAlyAs (where $0<y<1$) are formed one after another on the semiconductor substrate 10 consisting of GaAs. Here, the numbers x, y and z satisfy relationships represented by $x<y$ and $x<z$.

Within the p-type clad layer 11 in the proximity of said p-type active layer 12, a local formation of a n-type inverted layer 14, as shown in FIG. 11, may occur due to inadvertent introduction of n-type impurities and such. When this n-type inverted layer 14 is formed, the structure of the light emitting element is broken, and that portion becomes defective. On the other hand, within the n-type clad layer 13 in the proximity of said p-type active layer 12, a local formation of a p-type inverted layer 9, as shown in the figure, may occur due to inadvertent introduction of p-type impurities and such. When this p-type inverted layer 9 is formed, the structure of the light emitting element is broken and that part also becomes defective.

Also, since the p-type active layer 12 is relatively thin, the active layer deficient area 17 which is partially missing the p-type active layer 12, as shown in FIG. 11, may result due to abnormal conditions of epitaxial growth and such. This area also becomes a defect.

When said defects are formed in a wafer for manufacturing light emitting elements, as described above, the light emitting elements manufactured by using the areas which include them will have defective electrical characteristics and light emitting characteristics, and thus they will not be acceptable for use.

Conventionally, wafers for manufacturing light emitting elements have been inspected for defects as described above by means of measurement of their electrical characteristics. The procedure comprises, for example: Attaching electrodes to the manufactured wafer for manufacturing light emitting elements, separating each element by means of dicing, assembling it as a lamp, applying a constant electric current to it, and thus inspecting voltage characteristics. Since this inspection is destructive testing, it is not an inspection for an entire wafer surface, but is rather a partial inspection.

Since the conventional procedure for inspecting wafers for manufacturing light emitting elements, as described above, involves inspecting the electrical characteristics after assembling a certain portion of the wafer for manufacturing light emitting elements as a lamp, it was not possible to detect defective areas at the wafer stage.

Therefore, this method, as a method of inspecting wafers for manufacturing light emitting elements, has problems. It is destructive testing, it does not guarantee the characteristics of the entire wafer surface because it is a partial inspection, and it requires excessive time to obtain the inspection results.

SUMMARY OF THE INVENTION

The object of this invention is to provide a nondestructive and quick method for defect inspection of wafers for manufacturing light emitting elements.

This invention is a method of inspecting a wafer for manufacturing light emitting elements which has a double-hetero structure comprising an active layer and upper and lower clad layers sandwiching this active layer from the upper and lower sides formed on a semiconductor substrate, characterized by: applying an irradiation light containing a wavelength which is not absorbed by said upper clad layer but is absorbed by said active layer on said wafer for manufacturing light emitting elements, and observing the secondary light from said wafer for manufacturing light emitting elements caused by the irradiation to inspect said wafer for manufacturing light emitting elements for defects.

Specifically, said irradiation light contains light which has energy smaller than the band gap of the semiconductor composing said upper clad layer, and at the same time larger than the band gap of the semiconductor composing said active layer.

As for each layer of the wafer for manufacturing light emitting elements which is to be inspected, for example said active layer consists of a mixed crystal compound semiconductor represented by Ga1-xAlxAs (where $0<x<0.7$), said upper clad layer consists of a mixed crystal compound semiconductor represented by Ga1-yAlyAs (where $0<y<1$ and $x<y$), and said lower clad layer consists of a mixed crystal compound semiconductor represented by Ga1-zAlzAs (where $0<z<1$ and $x<z$).

When the defect occurring in said wafer for manufacturing light emitting elements is a conductivity-type inverted layer (such as indicated by numbers 9 and 14 in FIG. 11) which is formed in said upper clad layer or said lower clad layer in the proximity of said active layer, said secondary light is a photoluminescent light. The action of said conductivity-type inverted layer makes its intensity much greater than that from normal areas.

When the defects occurring in said wafer for manufacturing light emitting elements are active layer deficient areas where said active layer is partially missing, said secondary light is a reflection light occurring when said irradiation light goes through said active layer deficient areas and reaches and reflects from said semiconductor substrate surface.

For the light source for said irradiation light, any type of light source can be used as long as the output light contains the wavelength range prescribed above. For example, for a wafer for manufacturing light emitting elements with a double-hetero structure wherein said active layer consists of a mixed crystal compound semiconductor represented by Ga1-xAlxAs (where $0.25<x<0.7$), said upper clad layer consists of a mixed crystal compound semiconductor represented by Ga1-yAlyAs (where $0.25<y<1$ and $x<y$), and said lower clad layer consists of a mixed crystal compound semiconductor represented by Ga1-zAlzAs (where $0.25<z<1$ and $x<z$), a halogen lamp is used with a light wavelength range of 600-720 nm. In the case where said secondary light is observed by the naked eye, and if the secondary light is a photoluminescent light, then said defect can be detected as said conductivity-type inverted layer based on the contrast in the intensity. If the secondary light is a reflected light, then said defect can be detected as said active layer deficient area based on the differences in color compared with the photoluminescent light.

It is also possible to quantitatively measure said secondary light by means of a detector and such, and determine its intensity distribution or wave length distribution. In this case, the surface of said wafer for manufacturing light emitting elements is scanned with an excited laser light emitted from a laser light source to measure the intensity of said secondary light and determine the intensity distribution of said secondary light at a specific wave length on said wafer for manufacturing light emitting elements. The distribution of said defects can be determined by the intensity distribution of this secondary light.

DETAILED DESCRIPTION OF THE PREFERRED EMBODIMENTS

Figure 1:
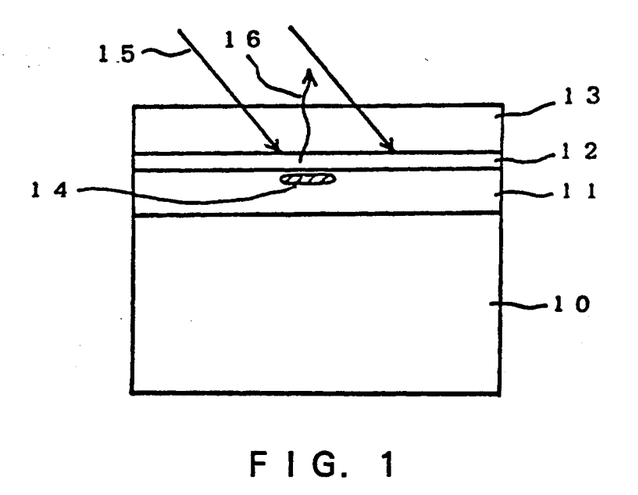
FIG. 1 shows irradiation of a light on a wafer for manufacturing light emitting elements in whose p-type clad layer a n-type inverted layer has been generated.

FIG. 1 explains the principle of this invention. In this figure, a p-type clad layer 11, a p-type active layer 12 and a n-type clad layer 13 are formed one after another on a semiconductor substrate 10 to compose a wafer for manufacturing light emitting elements. It is also assumed that a n-type inverted layer 14 is formed in the p-type clad layer 11 in the proximity of the p-type active layer 12.

Here, an irradiation light 15 which contains light which is not absorbed by the n-type clad layer 13 but is absorbed by the p-type active layer 12 is applied on the wafer for manufacturing light emitting elements. That is, this irradiation light 15 contains light which has energy smaller (i.e. longer wavelength) than the band gap of the semiconductor composing the n-type clad layer 13, and at the same time larger (i.e. shorter wave length) than the band gap of the semiconductor composing the p-type active layer 12.

Then a strong photoluminescent light 16 is emitted from the p-type active layer 12 on areas which contain the n-type inverted layer. The presence of the n-type inverted layer can be determined by photoluminescent light 16.

A concrete description will be given here by referring to FIGS. 1 through 6 and using a GaAlAs double-hetero type epitaxial wafer for 650 nm red light emitting diodes as an example.

Figure 3:
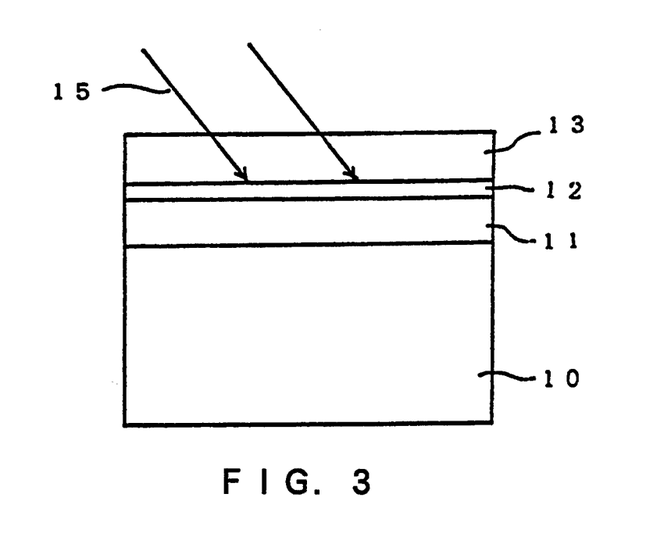
FIG. 3 shows irradiation of a light on a wafer for manufacturing light emitting elements which does not have defects.

As shown in FIG. 3, when the irradiation light 15 containing light with a wavelength range of 600-650 nm which is not absorbed by the n-type clad layer 13, but is absorbed by the p-type active layer 12, is applied on the wafer for manufacturing light emitting elements which does not have an n-type inverted layer in its p-type clad layer, the portion of the irradiation light which is in the wavelength range specified above goes through the n-type clad layer 13 and reaches the p-type active layer 12 where it is absorbed. Photoluminescent emission at a wavelength around 650 nm does occur but the intensity is very small.

However, as shown in FIG. 1, in the case of a wafer for manufacturing light emitting elements which has an n-type inverted layer 14 in its p-type clad layer 11 in the proximity of the p-type active layer 12, and if the irradiation light is applied to that area, then the light is absorbed by the p-type active layer 12 and at the same time a strong red photoluminescent light 16 with a wavelength around 650 nm occurs. This photoluminescent light 16 is a redder and stronger light than that from the normal areas and therefore it can be identified by the naked eye.

Figure 4:
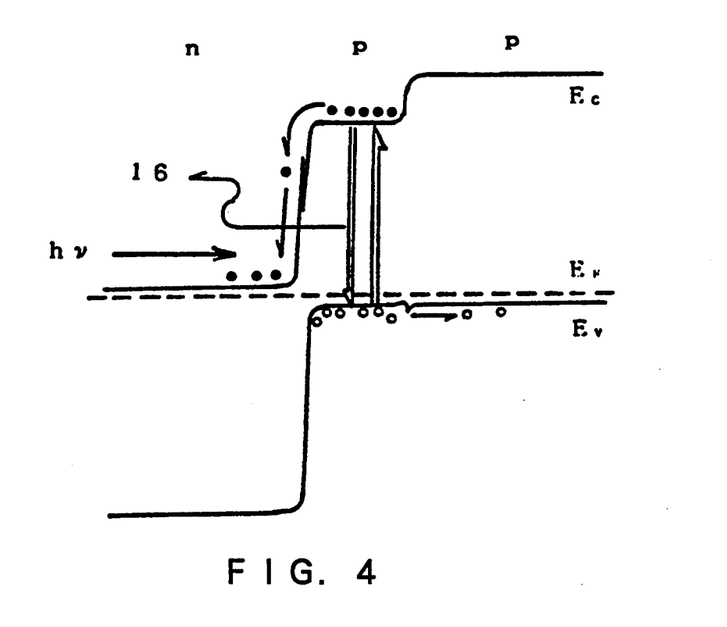
FIG. 4 shows the energy band structure which corresponds to a normal double-hetero structure without defects.
Figure 5:
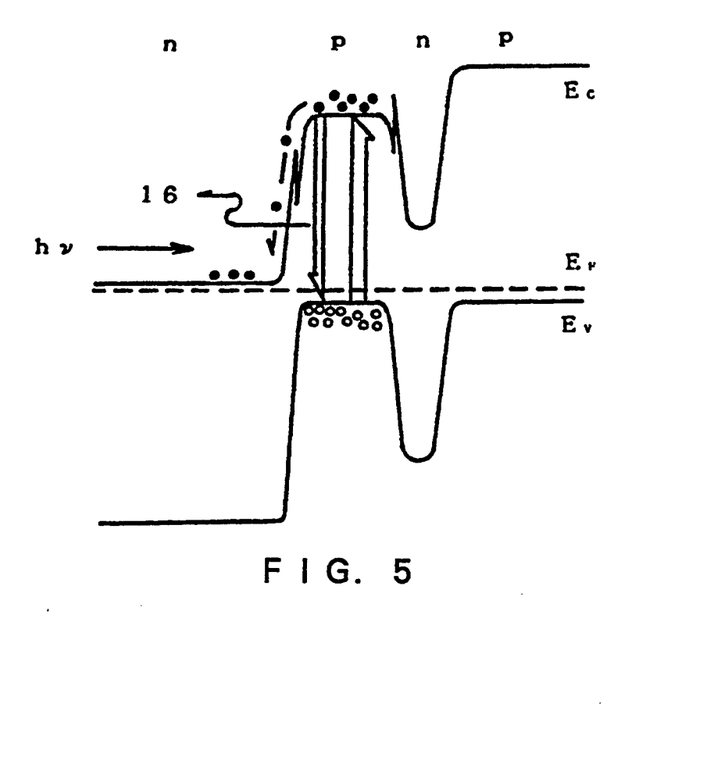
FIG. 5 shows the energy band structure for the case where an n-type inverted layer is formed in the p-type clad layer in the proximity of the p-type active layer.
Figure 6:
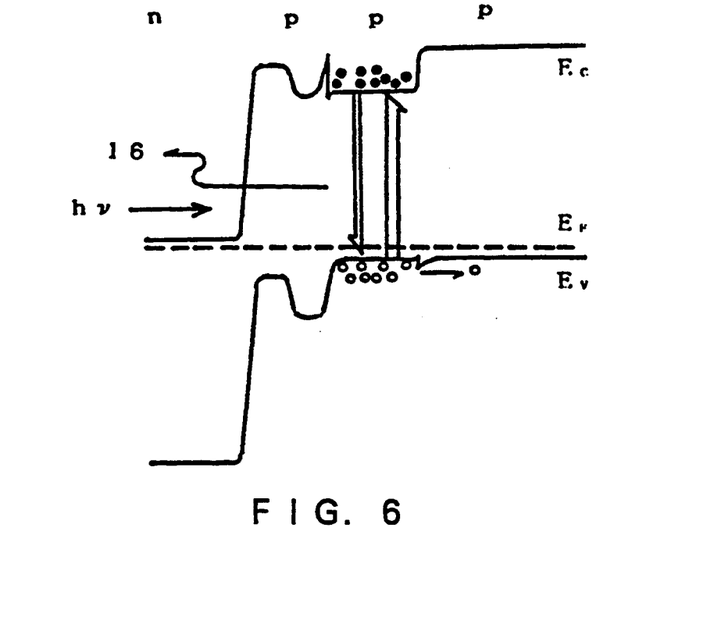
FIG. 6 shows the energy band structure for the case where a p-type inverted layer is formed in the n-type clad layer in the proximity of the p-type active layer.

FIGS. 4 through 6 explain this in terms of the energy band structure of the semiconductor. The energy band structure of the double-hetero structure portion of the wafer for manufacturing light emitting elements which does not have the n-type inverted layer 14 formed in it, as shown in FIG. 3, will be a structure as shown in FIG. 4. Here, the portions indicated, from right to left, as p, p and n correspond to the p-type clad layer 11, the p-type active layer 12 and the n-type clad layer 13, respectively.

In the case described above, the incident light with the energy of hv, coming from the left side of the figure goes through the n-type clad layer 13 and reaches the p-type active layer 12 where it is absorbed to generate a pair consisting of an electron and a positive hole.

The electrons and the positive holes generated, as described above, diffuse into the n-type clad layer 13 and the p-type clad layer 11, respectively, and the number of electrons and positive holes remaining in the p-type active layer 12 decreases. Therefore, the probability of these pairs of electrons and the positive holes recombining and generating light is very small and thus the intensity of the photoluminescent light will be very low.

However, when the n-type inverted layer 14 is partially formed in the p-type clad layer 11, as shown in FIG. 1, the energy band structure will be a structure as shown in FIG. 5. Here, a well structure is formed in the valence electron band in the area corresponding to the p-type active layer 12, and the positive hole confinement effect occurs. Therefore, the positive holes do not diffuse to the p-type clad layer 11 but remain in the p-type active layer 12, thus increasing the probability of recombination with electrons. As a result, photoluminescent light at an intensity larger than that of the normal case as shown in FIG. 3 is emitted, making it possible to detect the n-type inverted layer 14 by measuring the photoluminescent light.

Figure 2:
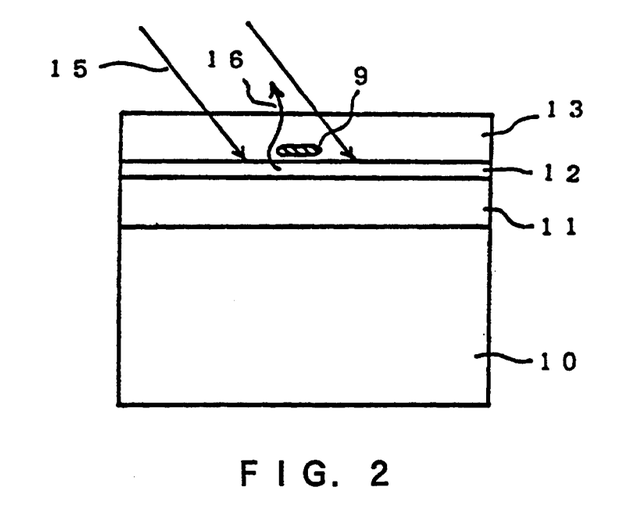
FIG. 2 shows irradiation of a light on a wafer for manufacturing light emitting elements in whose n-type clad layer a p-type inverted layer has been generated.

On the other hand, when a p-type inverted layer 9 is partially formed in the n-type clad layer 13, as shown in FIG. 2, the energy band structure will be a structure as shown in FIG. 6. Here, a well structure is formed in the conduction band in the area corresponding to the p-type active layer 12, and an electron confinement effect occurs. Therefore, the electrons do not diffuse to the n-type clad layer 13 but remain in the p-type active layer 12, thus increasing the probability of recombination with positive holes. As a result, photoluminescent light at an intensity larger than that of the normal case as shown in FIG. 3 is emitted, making it possible to detect also the p-type inverted layer 9 by measuring the photoluminescent light.

Said probability of recombination can be explained by using formulas as follows:

When there is no positive hole confinement effect as described above, the probability of recombination R is expressed by, $$R = B \cdot n \cdot p$$

where B is the emission recombination constant, n and p are the concentrations of electrons and positive holes, respectively. However, if there is a positive hole confinement effect, then, $$R = B \cdot n \cdot (P + \Delta P)$$

where $\Delta p$ is the increase in the concentration of the excited positive holes due to the confinement effect as described above. Thus, the probability of recombination increases and the emission of light is more likely to occur.

Also, when a well structure is formed which confines electrons in the conduction band, the probability of recombination increases similarly and the emission of light is more likely to occur. In this case, $$R = B \cdot (n + \Delta n) \cdot p$$

where $\Delta n$ is the increase in the concentration of the excited electrons due to the confinement effect.

Figure 7:
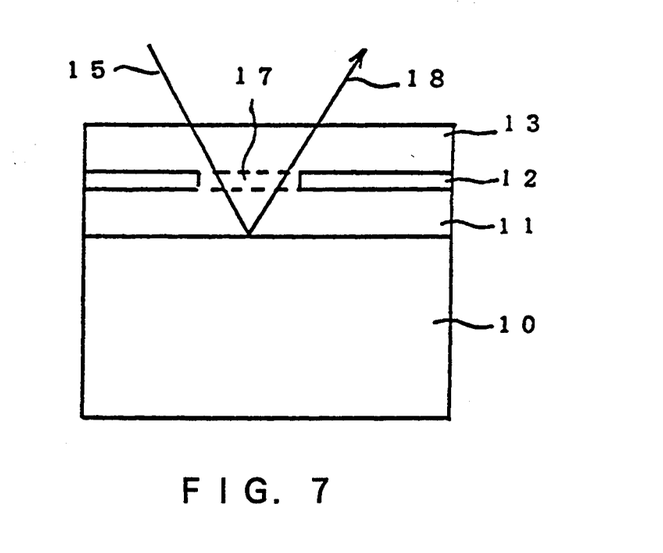
FIG. 7 shows irradiation of a light on a wafer for manufacturing light emitting elements which has a deficient active layer.

Next, when an active layer deficient area 17 which is partially missing the p-type active layer 12, as shown in FIG. 7, is present, the irradiation light 15 which reaches this area simply goes through and reaches the surface of the semiconductor substrate 10 where part of it is reflected and goes out of the wafer as the reflection light 18. In this case, the part of the irradiation light which has a wavelength of 600–650 nm, which should be absorbed by the p-type active layer 12, is not absorbed, and therefore the active layer deficient area 17 can be detected by measuring the reflection light 18 and checking whether the light in this wavelength range is present or not. The color of the reflection light 18 described above is red-orange, and thus it can be distinguished from the red light emission from the n-type inverted layer 14 (conductivity-type inverted layer) or from the p-type inverted layer 9.

Figure 8:
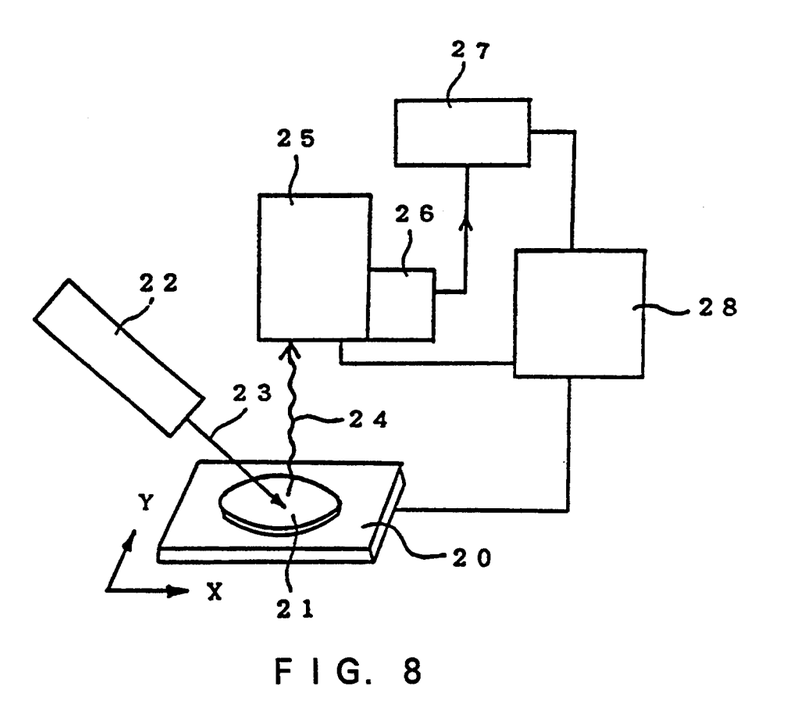
FIG. 8 shows a simplified block diagram of an example of an apparatus used in the inspection method of an example of this invention.

An example of this invention is explained below, using as an example a case where the surface of the wafer for manufacturing light emitting elements is scanned by a laser light and the secondary light is quantitatively measured by a detector. FIG. 8 shows the apparatus used in the method of this example.

In this figure, the wafer for manufacturing light emitting elements 21 is mounted on a X-Y stage 20 which is controlled to move in both the X and Y directions. The excited laser light 23 with a wavelength of 632.8 nm from a He-Ne laser source 22 is irradiated on the wafer for manufacturing light emitting elements 21. A spectrometer 25 is placed above the X-Y stage 20, and it separates the light of the prescribed wavelength from the secondary light 24 from the wafer for manufacturing light emitting elements. A detector 26 detects this separated light and converts it to an electrical signal. An amplifier 27 amplifies this signal, and the output is fed to a computer 28 which is used for operation control, calculations, etc. The computer 28 conducts processing on this signal to create wafer maps and such.

Next, the actual inspection procedure using the apparatus described above is explained below. First, we will explain the inspection for the occurrence of conductive inverted layers by detecting the photoluminescent light. In this case, the received light wavelength to be separated by the grating of said spectrometer 25 is set at 650 nm, and the excited laser light 23 is applied while the X-Y stage 20 is driven in such a way that the excited laser light 23 will scan the entire surface of the wafer for manufacturing light emitting elements 21.

The secondary light 24 from the wafer for manufacturing light emitting elements 21 is separated by the spectrometer 25, and only the photoluminescent light with a wavelength of 650 nm is detected by the detector 26 and converted to a corresponding amount of light intensity signal. This signal is amplified by the amplifier 27 and sent to the computer 28, where it is processed as a positional function on the surface of the wafer for manufacturing light emitting elements 21 to create a wafer map(s).

Figure 9:
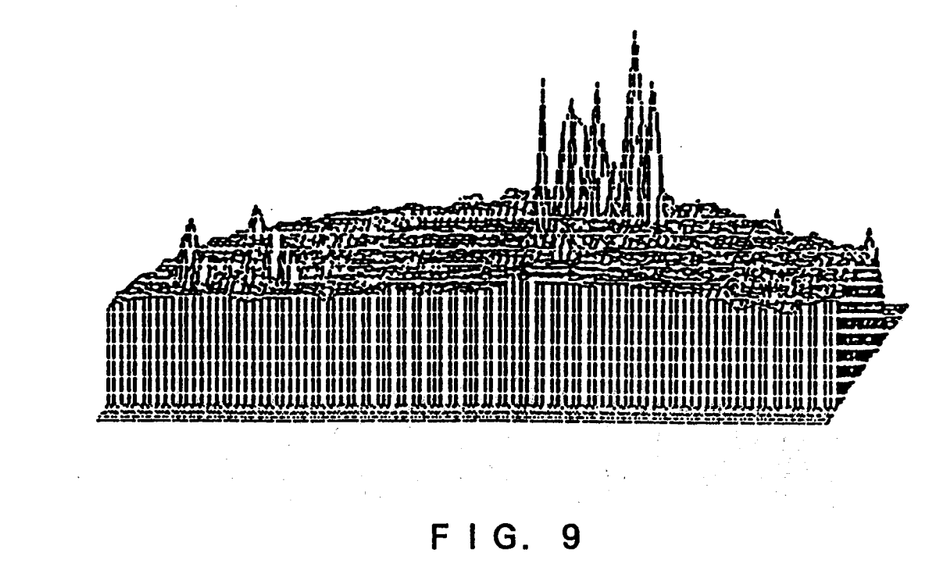
FIG. 9 shows a map of the intensity distribution of the photoluminescent light obtained by the inspection method of an example of this invention.

FIG. 9 shows a three-dimensional map of the intensity distribution on the wafer of the photoluminescent light from the wafer for manufacturing light emitting elements, as described above. In this figure, portions which extend sharply like needles correspond to areas where the photoluminescent light intensity is high. These areas correspond to the areas where an n-type inverted layer 9 or a p-type inverted layer 14, as shown in FIG. 11, is formed.

Figure 10:
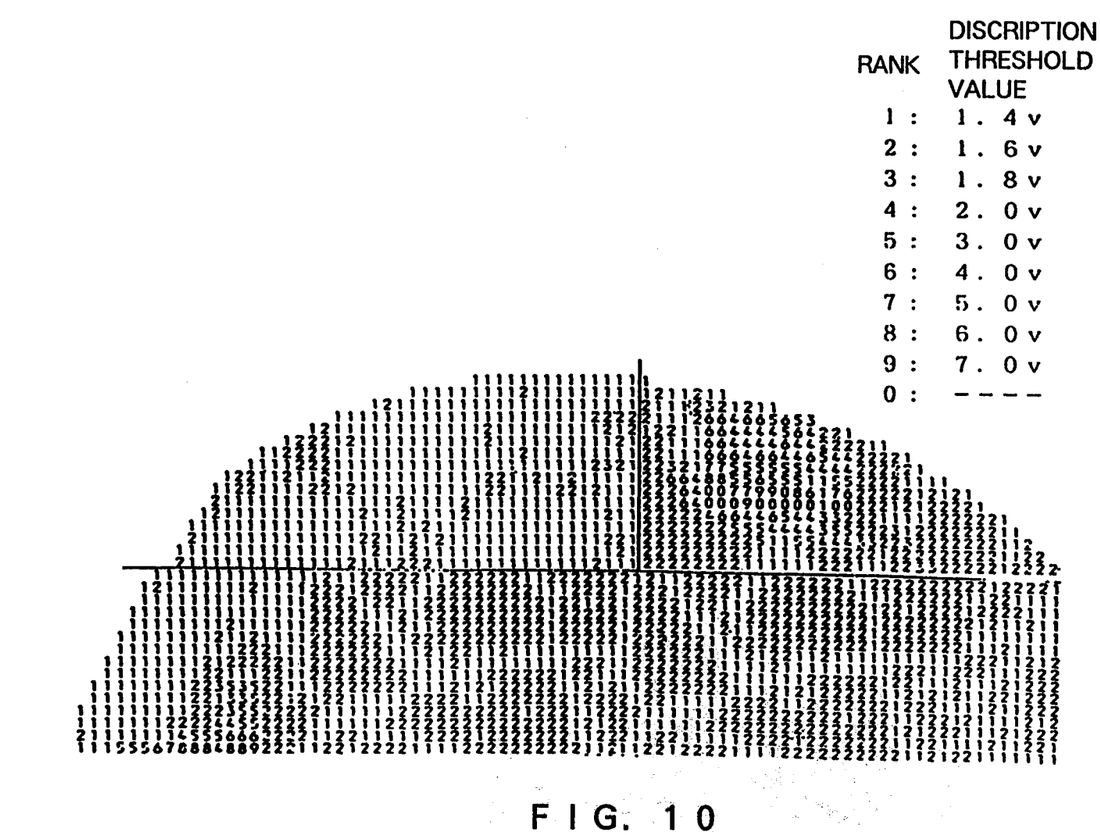
FIG. 10 shows a map of the distribution of the VF characteristics obtained by the conventional VF characteristics inspection.

As a reference, a voltage VF characteristics map at IF=100 microA after assembling lamps according to the conventional method is shown in FIG. 10. Each number represents a rank value based on the discrimination threshold values indicated on the upper right corner of the figure. The photoluminescent light intensity map obtained in this example, as shown in FIG. 9, is closely correlated to the VF characteristics map in FIG. 10, indicating that the entire surface of the wafer can be inspected for the generation of conductivity-type inverted layers without destructive testing such as is conventionally conducted.

For inspection for the p-type active layer 12 deficient areas, the wavelength of the spectrometer 25 should be set at 632.8 nm, which is the same wavelength as that of the excited laser light 23, and the inspection should be conducted in the same manner as described above.

In the example described above, a method which uses a laser light to scan the wafer surface is described as an example. However, it is needless to say that the inspection can be sufficiently conducted by using a halogen lamp and such as the irradiation light source and conducting the observation with the naked eye. In this case, both the defects due to generation of conductivity-type inverted layers and the defects due to missing active layers can be detected at the same time. That is, as described above, if a red light emission is observed, then generation of conductivity-type inverted layers is indicated, and if a red-orange reflection light is observed, then missing of active layers is indicated.

As described thus far, the effect of this invention is the capability of non-destructive and quick inspection of wafers for manufacturing light emitting elements for defects.

What is claimed is:

1. A method of inspecting a wafer to be used for manufacturing light emitting elements which have a double-hetero structure comprising an active layer and upper and lower clad layers sandwiching the active layer from upper and lower sides formed on a semiconductor substrate, comprising the steps of:
   applying an irradiation light containing a wavelength which is not absorbed by said upper clad layer but is absorbed by said active layer on said wafer;
   inspecting for defects by observing the secondary light from said wafer caused by the irradiation light; and
   wherein the defects occurring in said wafer for manufacturing light emitting elements are active layer deficient areas where said active layer is partially missing, and said secondary light is a reflection light occurring when said irradiation light goes through said active layer deficient areas and reaches and reflects from said semiconductor substrate surface.

2. A method of inspecting a wafer to be used for manufacturing light emitting elements as described in claim 1
   wherein said irradiation light contains light which has energy smaller than the band gap of the semiconductor composing said upper clad layer, and at the same time larger than the band gap of the semiconductor composing said active layer.

3. A method of inspecting a wafer to be used for manufacturing light emitting element as described in claim 1 wherein said active layer consists of a mixed crystal compound semiconductor represented by $Ga_{1-x}Al_xAs$ (where $0<x<0.7$), said upper clad layer consists of a mixed crystal compound semiconductor represented by $Ga_{1-y}Al_yAs$ (where $0<y<1$ and $x<y$), and said lower clad layer consists of a mixed crystal compound semiconductor represented by $Ga_{1-z}Al_zAs$ (where $0<z<1$ and $x<z$).

4. A method of inspecting a wafer to be used for manufacturing light emitting elements as described in claim 2,
   wherein said active layer consists of a mixed crystal compound semiconductor represented by $Ga_{1-x}Al_xAs$ (where $0<x<0.7$), said upper clad layer consists of a mixed crystal compound semiconductor represented by $Ga_{1-y}Al_yAs$ (where $0<y<1$ and $x<y$), and said lower clad layer consists of a mixed crystal compound semiconductor represented by $Ga_{1-z}Al_zAs$ (where $0<z<1$ and $x<z$).

5. A method of inspecting a wafer to be used for manufacturing light emitting elements as described in claim 1,
   wherein an additional defect occurring in said wafer for manufacturing light emitting elements is a conductivity-type inverted layer which is formed in said upper clad layer or said lower clad layer in the proximity of said active layer;
   said secondary light is a photoluminescent light whose emission is initiated by the incidence of said irradiation light into said active layer; and
   the inspection for defects is conducted by utilizing the conspicuous increase of the intensity of said photoluminescent light, compared with that from normal areas, caused by the action of said conductive inverted layer.

6. A method of inspecting a wafer to be used for manufacturing light emitting elements as described in claim 2,
   wherein an additional defect occurring in said wafer for manufacturing light emitting elements is a conductivity-type inverted layer which is formed in said upper clad layer or said lower clad layer in the proximity of said active layer;
   said secondary light is a photoluminescent light whose emission is initiated by the incidence of said irradiation light into said active layer; and
   the inspection for defects is conducted by utilizing the conspicuous increase of the intensity of said photoluminescent light, compared with that from normal areas, caused by the action of said conductive inverted layer.

7. A method of inspecting a wafer to be used for manufacturing light emitting element as described in claim 3,
   wherein an additional defect occurring in said wafer for manufacturing light emitting elements is a conductivity-type inverted layer which is formed in said upper clad layer or said lower clad layer in the proximity of said active layer;
   said secondary light is a photoluminescent light whose emission is initiated by the incidence of said irradiation light into said active layer; and
   the inspection for defects is conducted by utilizing the conspicuous increase of the intensity of said photoluminescent light, compared with that from normal areas, caused by the action of said conductive inverted layer.

8. A method of inspecting a wafer to be used for manufacturing light emitting elements as described in claim 4,
   wherein an additional defect occurring in said wafer for manufacturing light emitting elements is a conductive inverted layer which is formed in said upper clad layer or said lower clad layer in the proximity of said active layer;

said secondary light is a photoluminescent light whose emission is initiated by the incidence of said irradiation light into said active layer; and the inspection for defects is conducted by utilizing the conspicuous increase of the intensity of said photoluminescent light, compared with that from normal areas, caused by the action of said conductive inverted layer.

9. A method of inspecting a wafer to be used for manufacturing light emitting elements as described in claim 1, wherein said active layer consists of a mixed crystal compound semiconductor represented by Ga1-xAlxAs (where $0.25<x<0.7$), said upper clad layer consists of a mixed crystal compound semiconductor represented by Ga1-yAlyAs (where $0.25<y<1$ and $x<Y$), said lower clad layer consists of a mixed crystal compound semiconductor represented by Ga1-zAlzAs (where $0.25<z<1$ and $x<z$), the light source of said irradiation light is a halogen lamp whose light contains a wavelength range of 600–720 nm, said secondary light is observed by the naked eye, conductive inverted layers occurring in said upper clad layer or in said lower clad layer in the proximity of said active layer are detected based on their differences from the photoluminescent light intensity from normal areas, and active layer deficient areas wherein said active layer is partially missing are detected by using the reflected light from said semiconductor surface.

10. A method of inspecting a wafer to be used for manufacturing light emitting elements as described in claim 1,
wherein said irradiation light is an excited laser light emitted from a laser light source, the surface of said wafer for manufacturing light emitting elements is scanned with this excited laser light to measure the intensity of said secondary light and determine the intensity distribution of said secondary light on said wafer.

11. A method of inspecting a wafer to be used for manufacturing light emitting elements as described in claim 2,
wherein said irradiation light is an excited laser light emitted from a laser light source, the surface of said wafer for manufacturing light emitting elements is scanned with this excited laser light to measure the intensity of said secondary light and determine the intensity distribution of said secondary light on said wafer.

12. A method of inspecting a wafer to be used for manufacturing light emitting elements as described in claim 3,
wherein said irradiation light is an excited laser light emitted from a laser light source, the surface of said wafer for manufacturing light emitting elements is scanned with this excited laser light to measure the intensity of said secondary light and determine the intensity distribution of said secondary light on said wafer.

13. A method of inspecting a wafer to be used for manufacturing light emitting elements as described in claim 4,
wherein said irradiation light is an excited laser light emitted from a laser light source, the surface of said wafer for manufacturing light emitting elements is scanned with this excited laser light to measure the intensity of said secondary light and determine the intensity distribution of said secondary light on said wafer.

14. A method of inspecting a wafer to be used for manufacturing light emitting elements as described in claim 5,
wherein said irradiation light is an excited laser light emitted from a laser light source, the surface of said wafer for manufacturing light emitting elements is scanned with this excited laser light to measure the intensity of said secondary light and determine the intensity distribution of said secondary light on said wafer.

15. A method of inspecting a wafer to be used for manufacturing light emitting elements as described in claim 6,
wherein said irradiation light is an excited laser light emitted from a laser light source, the surface of said wafer for manufacturing light emitting elements is scanned with this excited laser light to measure the intensity of said secondary light and determine the intensity distribution of said secondary light on said wafer.

16. A method of inspecting a wafer to be used for manufacturing light emitting elements as described in claim 7,
wherein said irradiation light is an excited laser light emitted from a laser light source, the surface of said wafer for manufacturing light emitting elements is scanned with this excited laser light to measure the intensity of said secondary light and determine the intensity distribution of said secondary light on said wafer.

17. A method of inspecting a wafer to be used for manufacturing light emitting elements as described in claim 8,
wherein said irradiation light is an excited laser light emitted from a laser light source, the surface of said wafer for manufacturing light emitting elements is scanned with this excited laser light to measure the intensity of said secondary light and determine the intensity distribution of said secondary light on said wafer.

* * * * *